United States Patent [19]

Chang et al.

[11] 4,062,747
[45] Dec. 13, 1977

[54] NATIVE GROWTH OF SEMICONDUCTOR OXIDE LAYERS

[75] Inventors: Robert Pang Heng Chang, Warren; Ashok Kumar Sinha, Murray Hill, both of N.J.

[73] Assignee: Bell Telephone Laboratories, Incorporated, Murray Hill, N.J.

[21] Appl. No.: 696,282

[22] Filed: June 15, 1976

[51] Int. Cl.$^2$ ............................................. B01K 1/00
[52] U.S. Cl. ................................... 204/164; 250/531
[58] Field of Search ..................... 250/531; 204/164

[56] References Cited

U.S. PATENT DOCUMENTS 3,287,243  11/1966  Ligenza .................................. 204/192
3,957,608  5/1976  Streel .................................... 204/192

*Primary Examiner*—F.C. Edmundson
*Attorney, Agent, or Firm*—Peter V. D. Wilde

[57] ABSTRACT

An amorphous, stoichiometric, native, semiconductor oxide layer, with a sharp interface between the oxide layer and the substrate, is grown by directing electrons toward a semiconductor substrate in the presence of oxygen. The source of electrons may be a simple filament. This invention may be implemented with standard plasma growth techniques by extracting the electrons from the plasma production region and directing them to the substrate.

12 Claims, 8 Drawing Figures

NATIVE GROWTH OF SEMICONDUCTOR OXIDE LAYERS

BACKGROUND OF THE INVENTION

1. Field of the Invention

This invention is a technique for growing amorphous, stoichiometric, native, semiconductor oxide layers with a sharp interface region.

2. Description of the Prior Art

Oxide layers play an important role in semiconductor technology; for example, as insulators in metal oxide semiconductor field effect transistors and as passivating layers and isolating regions in other semiconductor devices.

Techniques for growing oxide layers are well established in the art. In silicon technology two major techniques for the growth of native silicon oxide layers predominate. In the first process a silicon substrate is exposed to oxygen at a temperature of approximately 1100° C. As a result, the silicon and oxygen interact to yield a Si oxide layer. Alternatively, the Si substrate may be exposed to a high energy oxygen plasma which again results in the growth of an oxide layer. Depending upon the energy of the plasma, layers as thick as 5000 angstroms may be fabricated.

While silicon technology is highly developed, comparable technology using compound semiconductors, such as GaAs, has not reached such a degree of sophistication. Such compound semiconductors are highly desirable because of their high band gap and high electron mobility. Consequently, any technique which enables the fabrication of compound semiconductor oxide films is of significant interest. The two techniques mentioned above for oxidizing silicon have been applied to the production of GaAs oxide layers, but both are significantly less practical in such an application. The heating technique is not practical in GaAs because the As is highly volatile at the elevated temperatures required for this technique and the resulting layer is, consequently, not stoichiometric. In addition, at these temperatures the GaAs oxide layer does not remain amorphous but rather crystalizes. The high energy plasma technique on the other hand, results in significant radiation-induced damage and poorly defined interface region between the oxide film and the substrate. Under such circumstances, the interface has associated with it many surface states and trapped charges which make the oxide unsuitable for many device applications.

In an article in the *Journal of Applied Physics*, Vol. 37, page 2924, 1966, O. A. Weinreich discusses a low temperature plasma oxidation technique for growing GaAs films. The film is grown in a quartz gas discharge tube in which an oxygen plasma is supported. Weinreich indicates that the primary mechanism responsible for the observed film growth involves the extraction of negative oxygen ions from the plasma and their diffusion into the GaAs substrate. Since plasmas have very low negative ion densities, this technique requires plasmas with large charge particle densities and large oxygen background pressures, in order to yield the requisite number of negative oxygen ions. The power necessary to support such plasmas is comparatively high and this has discouraged detailed investigation of this technique. Weinreich's statements regarding the importance of negative oxygen ions suggest that low density plasmas will not be effective, and he and others in the art have avoided for nearly ten years investigation of low density plasmas for this application. This only serves to confirm the persuasiveness of teachings such as Weinreich's to practitioners in the art.

SUMMARY OF THE INVENTION

Applicants have discovered that native semiconductor oxide growth may be efficiently effected by impinging electrons of a specified density and energy on a semiconductor substrate in the presence of a specified pressure of oxygen.

The generic embodiment of applicant's invention requires only a source of electrons, a means for directing the electrons toward the substrate, and a device capable of maintaining the requisite oxygen pressure in the interaction chamber. However, in a specific embodiment a plasma is used. It had been previously theorized that the negative ions normally present in plasmas, and not the electrons, were responsible for the film growth. Applicants have discovered, however, that the primary mechanism responsible for the growth of semiconductor oxide films in a plasma is not associated primarily with the negative ions normally resident in the plasma. Rather, applicants have discovered that the electrons present in the plasma interact with atoms and molecules near the surface of the substrate to produce the observed film growth. As a result of this discovery, applicants have shown that the plasma oxidation technique may be practiced at much lower charge particle densities and background pressures than heretofore recognized possible. High particle densities are not necessary to improve the efficiency of the process. Applicants have focused rather on the electron density of the plasma and on means for improving the efficiency with which these electrons are transported to the surface of the semiconductor.

As a result of their analysis, applicants have shown that efficient growth of semiconductor oxide films such as GaAs oxide may be effected by using plasmas of particle density $n < 10^{12}$ particles/cc and background pressures $p_b < 9 \times 10^{-3}$ torr. At these pressures and charge particle densities, the equilibrium negative oxygen ion density normally associated with the plasma is too low to effect significant film growth. However, applicants have found that if the plasma electrons are efficiently guided to the semiconductor substrate, for example by means of a magnetic field, efficient oxide growth occurs even at the low particle densities and background pressures specified.

Applicants have further shown that using their technique, the grown films are amorphous, stoichiometric and have a sharp interface region which is approximately 2 percent of the oxide layer in extent. While the process is self-limiting, it is found that films at least as thick as 5,000 angstroms may be produced. The damage normally associated with high energy plasmas or high temperature processes is not present using this process.

DETAILED DESCRIPTION

Applicants' invention involves the realization that native semiconductor oxide film growth may be efficiently effected by directing a specified density of electrons toward a semiconductor substrate in the presence of a specified pressure of oxygen. In this invention the oxide layer is grown rather than deposited. The oxide layer may be selectively grown in certain regions of the substrate by appropriately masking the substrate or by selectively guiding the electrons to specified regions of the substrate. This invention may be used to grow oxide layers on substrates which have been connected to conducting metallic surfaces or leads; for example, gold connectors. The process does not effect the conducting metallic surface and its presence does not reduce the effectiveness of the process. The source of electrons is not critical to the practice of this invention and two particular electron sources will be discussed.

Figure 1:
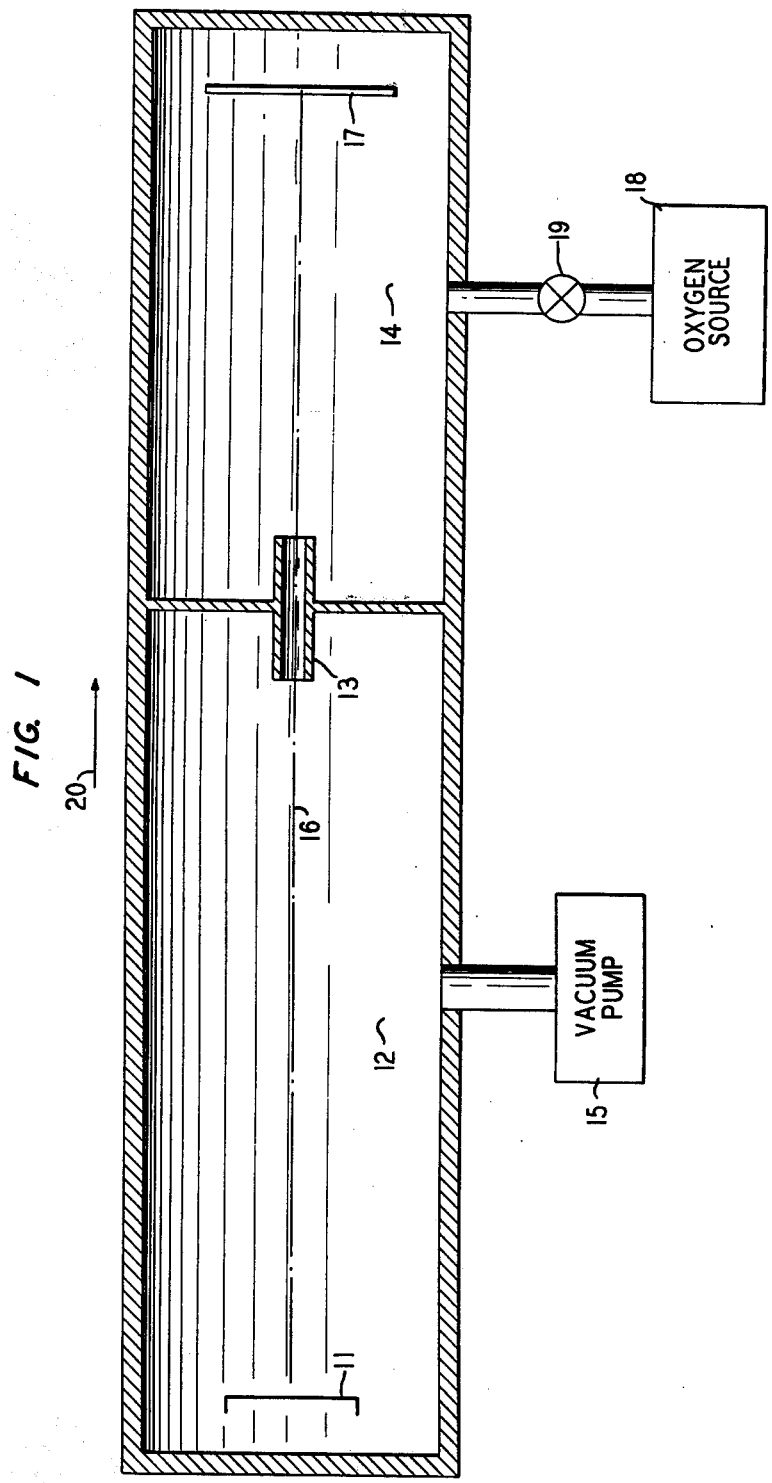
FIG. 1 is a simplified schematic of an apparatus used in the practice of this invention.

In FIG. 1, a simple tungsten filament, 11, is used to generate a current of electrons. These electrons are then directed toward an interaction region where the semiconductor substrate, 17, is located in an appropriate $O_2$ atmosphere. The pressure is sufficient so that the electrons traverse at least one mean free path with respect to electron-oxygen interactions, before they reach the substrate. Generally, the oxygen pressure should be less than $9 \times 10^{3 1 3}$ torr. If the oxygen pressure is above $9 \times 10^{-3}$ torr, the electron oxygen interaction will be so great that few electrons will interact in the vicinity of the substrate surface where the electron oxygen interaction is most efficient in effecting film growth. In typical embodiments, where the distance between the electron source and the substrate is on the order of a meter, the oxygen pressure will be between $1 \times 10^{-4}$ torr and $9 \times 10^{-3}$ torr.

The electron beam, 16, shown in FIG. 1 need not be limited in cross sectional extent but may rather be of any convenient size. However, to effect growth rates which are practical for commercial consideration, densities of from $10^8$ electrons/cc to $10^{12}$ electrons/cc are found to be useful. Densities of less than $10^{11}$ electrons/cc are also found to be practical for commercial application. The beam need not be composed purely of electrons but need be only substantially electrons. As long as the electron flux (electrons/cm$^2$.sec) is at least a factor of two times greater than the flux of other beam constituents, the process is effective.

In the practice of this invention the compound semiconductor substrate is biased positively relative to the electron source by a means 29. Bias voltages between 0.2 volts and 500 volts are found effective. The bias voltage directs the electrons toward the substrate. It is found that if the bias voltage is greater than 500 volts the oxide film growth is less efficient.

In the embodiment of FIG. 1 the system is immersed in a magnetic field, 20, which serves to further guide the electron beam towards the substrate. Additional electric or magnetic fields, or other directing means, may be used to aid in guiding the electrons. The orientation of the semiconductor surface will determine the number of electrons per unit surface impinging on the surface, and hence the efficiency of the process. Orienting the substrate surface approximately perpendicular to the electron beam increases the oxide layer growth rate.

Returning now to FIG. 1, 11 is a coiled tungsten filament approximately 1.5 inches in extent. The filament has a two-dimensional spiral in it and is aligned perpendicular to the electron beam. 600 watts of power at 20 volts is applied to the tungsten filament rendering it electron-emissive. The electron production region, 12, is maintained at a pressure of approximately $10^{-4}$ torr during this experiment. A differential pumping tube, 13, permits at least an order of magnitude difference in pressure between the interaction region 14 and the electron production region 12. In this example, a single pump 15 is used to evacuate the apparatus. However, alternative embodiments may use a pump in the interaction region as well as the production region. Oxygen is leaked into the interaction region from a source 18 through a valve 19 at a sufficient rate so that the pressure within the interaction region is approximately $10^{-3}$ torr. A magnetic field greater than 50 gauss may be used and is represented by 20.

Figure 2:
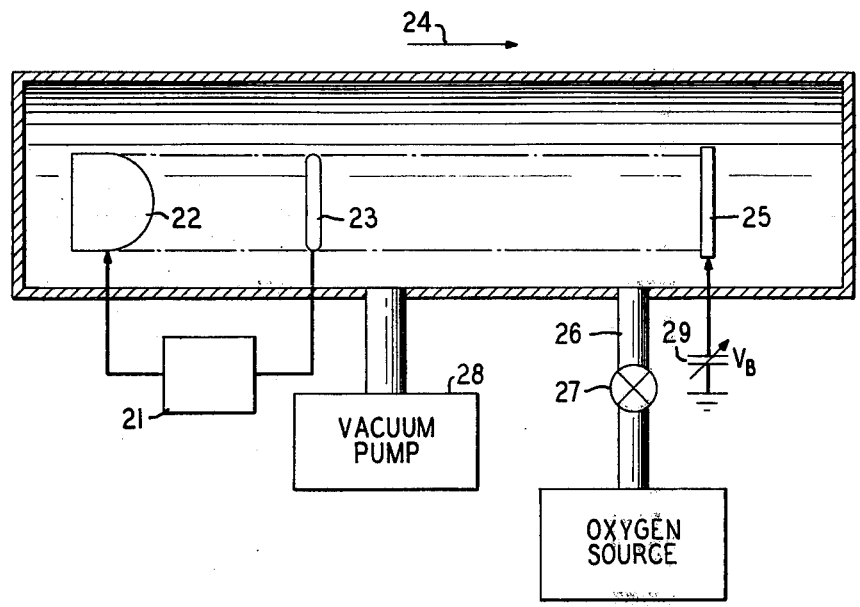
FIG. 2 is a schematic of a plasma apparatus which may be used in an alternative embodiment of this invention.

In FIG. 2 this invention is shown as applied to plasma oxidation techniques. Heretofore it was believed that the oxide growth observed with such plasmas was associated with the relatively small numbers of negative oxygen ions present in an oxygen plasma. The plasma consists of positively and negatively charged species. The negative species are primarily electrons; however, a small number of negatively charged atoms are also present in the plasma. If this is the source of the negative ions which are responsible for the oxidation then high plasma densities must be used in order to supply the requisite number of negative ions necessary for practical film growth. Consequently, the techniques disclosed in the prior art involve plasmas with high charge densities and high background pressures. Such plasmas require large power supplies for their initiation and stable maintenance.

In the instant invention, as applied to the plasma technique, one is not necessarily dependent on the negative oxygen ion density inherent in the plasma but rather on the electron density. The emphasis is on efficiently transporting electrons of a specified density and energy from the plasma to the semiconductor substrate in the presence of a specified pressure of oxygen.

A plasma apparatus for practicing the instant invention is shown in FIG. 2. This apparatus involves the use of plasma to produce the electrons necessary for the practice of this invention. In FIG. 2, 21 represents a typical power supply, and 22 and 23 are the electrodes between which the plasma is produced. Electrode 23 has an aperature through which the plasma may be transported in order to effectively transport the electrons produced in the plasma to the substrate. This embodiment involves the use of an external magnetic field represented by 24. The field is generally greater than 50 gauss. The magnetic field may be produced using current-carrying coils as is common in the art. More sophisticated techniques known to those skilled in the art may be used as well. The magnetic field serves to aid in guiding the electrons to the substrate, and allows for lower pressures at a given charge density.

The electrons are transported to the substrate, 25, which is held with an appropriate supporting means. The substrate surface is held perpendicular to the magnetic field so as to expose it to a maximum number of electrons. Oxygen is introduced into the interaction region by a means of a gas-inlet tube 26, and a valve 27. This technique can be practiced with plasma densities $n$ less than $10^{12}$ particles/cc. The oxygen background pressure may be kept low by means of a pump 28, and is generally less than $9 \times 10^{-3}$ torr. If oxygen is independently introduced into the interaction region then the plasma supporting gas may be any one of the typical inert plasma-supporting gases such as He, $N_2$, Ar, Kr, Xe. However, oxygen may be used as the plasma-supporting gas as well and in such a case the inlet 26 may be dispensed with. Layers have been grown on GaAs, GaPh, and GaAlAs using this invention. Proper adjustment of the parameters will yield growth in other compound semiconductors, or simple semiconductors such as Si.

As mentioned above, the oxide growth is most efficient when the semiconductor surface is oriented perpendicular to the electron beam. Consequently, selective oxide growth will occur when a semiconductor body is placed in the interaction region. Those portions of the body which are oriented approximately perpendicular to the electron beam will experience much more rapid oxide growth than other portions of the body especially those oriented approximately parallel to the electron beam. Previous growth techniques are generally isotropic and hence do not have a preferred direction of growth.

Figure 7:
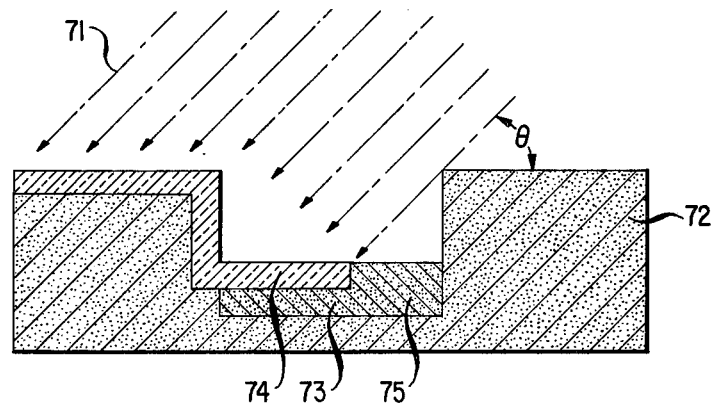
FIG. 7 represents the growth of an oxide layer on a selected region of a semiconductor surface using this invention in conjunction with a shadow mask technique.
Figure 8:
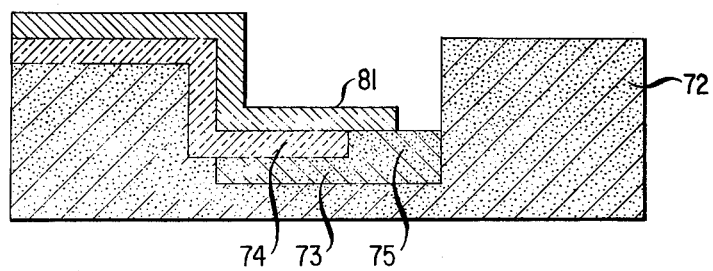
FIG. 8 represents a simple transistor fabricated using the technique shown in FIG. 7.

The directional preference inherent in this process allows for the selective growth of oxide layers using a shadow mask technique. FIG. 7 is a schematic representation of the growth of an oxide layer using the instant invention in conjunction with a shadow mask technique. In this FIG., the semiconductor 72 is oriented at an angle $\theta$ of between 0.5° and 89.5° relative to the electron beam 71. As a result of this orientation, the semiconductor surface 75 is not exposed to the electron beam and hence experiences no oxide growth. The semiconductor surface 74 is exposed to the electron beam and oxide growth occurs in this region consistent with the teachings of this invention. The regions 73 and 75 remain of uniform conductivity and different than that of region 72. In this example a portion of the body itself acts as the shadow mask. Alternatively, a second body may be used as the mask. Masking procedures which may be used in conjunction with this invention are not limited to shadow masks, which do not contact the area being masked, but may also include masks which contact the area being masked. In FIG. 8, the device of FIG. 7 has been metallized with a conductive layer 81 to provide electrical access to the semiconductor 73. The elementary transistor which results is a particularly simple embodiment of this invention as it is used in conjunction with the shadow mask technique. However, more complicated structures may be factricated using this technique, and such processes remain within the spirit of this invention.

The above discussion specified those aspects of the invention which are useful in distinguishing it over those practices prevalent in the prior art. Further specific characteristics of the process are discussed in the following example:

EXAMPLE 1

An oxygen plasma (density $\simeq 10^{10}$ particle/cm$^3$, $T_e \simeq$ 4eV) was formed at a background pressure of $2 \times 10^{-3}$ torr and an ambient temperature of ~ 40° C with a pair of RF aluminum electrodes as shown in FIG. 2. The electrodes were driven in balance at the same DC potential with a typical RF power of 300 watts between 20–30 MHz. The plasma thus formed in the source region of the plasma device was confined by an external magnetic field of 500 gauss. The plasma column was 5cm in diameter and 50cm long. A GaAs wafer was first cleaned in dilute HCl and then mounted on a Monel substrate holder which was immersed in the oxygen plasma. The wafer surface was 30cm away from the electrodes, to avoid sputtering contamination from the aluminum electrodes, and normal to the magnetic field lines. The substrate was then biased at 50–90 volts positive with respect to the plasma for collecting electrons.

Figure 3:
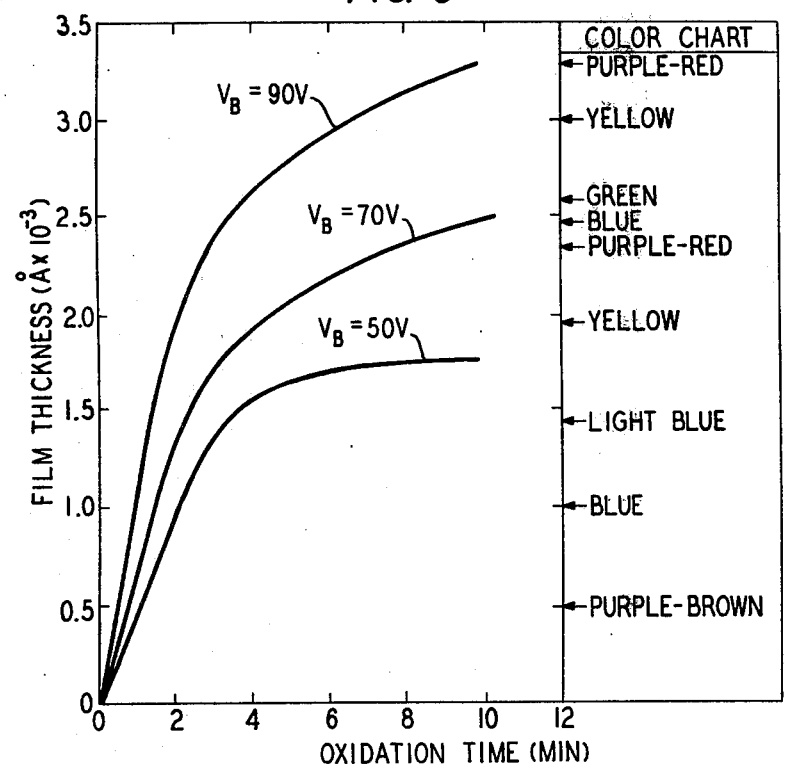
FIG. 3 is a plot of the oxygen film thickness as a function of time for different bias voltages.

FIG. 3 shows the oxide thickness $x_o$ (measured with the Talystep) as a function of time for different bias voltages, $V_b$, with respect to the plasma. The observed color for each film thickness is listed in the color chart on the right. The film growth starts out faster than parabolic ($\sim t^{3/4}$), but then after a few minutes it slows down ($\sim t^{1/3}$). The rate of oxidation is controlled by the applied bias on the substrate, the diffusion of the charged species in GaAs oxide, and the charged particle flux from the plasma at the oxide-plasma interface. The latter depends on the bias voltage $V_b$, and the plasma density and temperature. We have also tried to observe the growth of the oxide film when the GaAs substrate was oriented parallel to the external magnetic field lines. In this case the growth rate was drastically reduced.

The plasma grown oxide films were analyzed by X-ray and electron diffraction, and were found to be amorphous. Ellipsometric measurements ($\lambda = 5461$ angstroms) gave an index of refraction of 1.9 and these films had a thickness uniformity (a function of plasma density uniformity) of better than 10%. The films were readily dissolved in dilute HCl and slowly ($\sim$ 100 angstroms/min) in boiling water. The film stress was determined from change in wafer curvature; it ranged from $1.5-2 \times 10^9$ dynes cm$^{-2}$ tensile.

For electrical measurements, the oxide was stripped from the back side of the wafer, and aluminum dots were evaporated onto the front side through a mechanical mask. A large area back aluminum contact was formed on the GaAs. I-V and C-V measurements were made in a test facility equipped with an Electroglas 910 prober. The apparatus was enclosed in a light-tight dry $N_2$ glove box.

Figure 4:
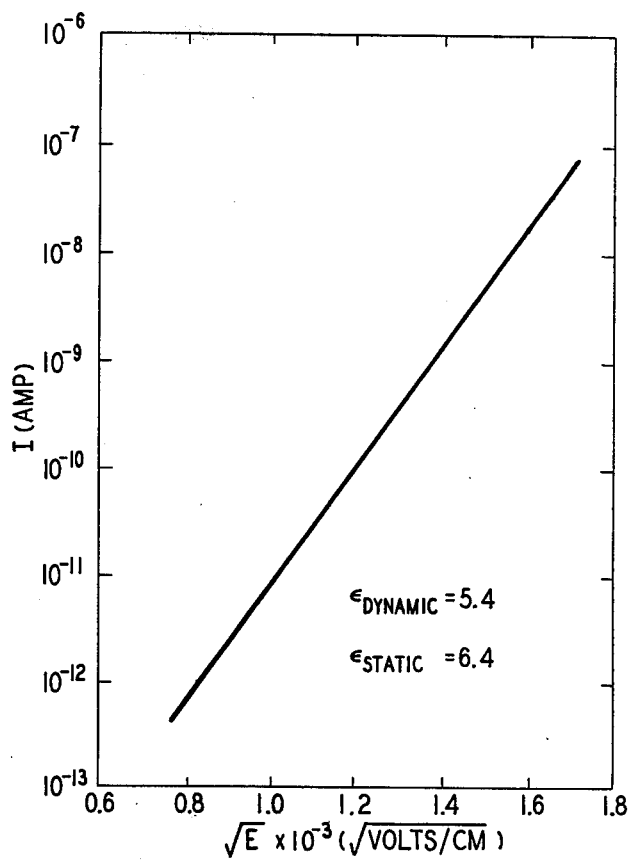
FIG. 4 is an I-V characteristic curve for a MOS capacitor fabricated using this invention.

FIG. 4 shows typical current-voltage characteristics at room temperature for an oxidized GaAs (100 orientation, Te doped, $N_D \simeq 2 \times 10^{17}$ cm$^{-3}$). The I-V plots were independent of polarity of the metal field plate indicating that the current was mainly limited by bulk conduction through the dielectric.

Figure 5:
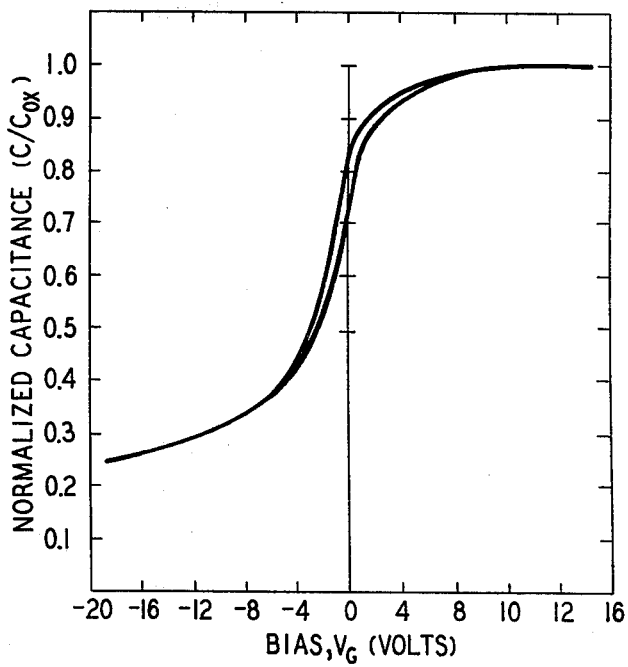
FIG. 5 is a typical C-V curve for a MOS capacitor fabricated using this invention.

The high frequency C-V curve shown in FIG. 5 was obtained on 1000 angstroms thick oxide film grown on a vapor-phase epitaxial layer of (100) GaAs (S doped, $N_D \simeq 2 \times 10^{15}$cm$^{-3}$, $\sim 10\mu$ thick). These samples also received a $H_2$ anneal (450° C, one-half hr.) prior to evaporation of aluminum dots. This treatment substantially reduced but did not eliminate interface states which cause the C-V curves to stretch out and prevent the formation of an inversion layer. The MOS sample of FIG. 5 has a flat band voltage of −0.6 (± 0.2) and a fixed charge density of $2.2 \times 10^{11}$ cm$^{-2}$. After bias-temperature aging at 250° C, for 15 minutes with an applied gate bias of $\pm 10^6$V/cm, the C-V curves shifted by +0.5V and −3.4V respectively.

The film composition was determined by 2 Mev $^4$He$^\times$ ion backscattering, and ion induced X-ray measurements. These studies showed that the oxide films were homogeneous and they have a gallium to arsenic ratio of from 0.9 to 1.2 with O/Ga+As ~ 1.5 implying that the oxide was composed primarily of Ga$_2$O$_3$, As$_2$O$_3$. The density of the oxide films was found to be 5 g/cm$^3$. Preliminary Auger measurements indicated that the oxide-substrate interface may well be less than 80 angstroms wide. Further work indicated that the interface region is between 1 and 3 percent of the oxide layer and may be less than 2½ percent than the oxide layer.

EXAMPLE 2

A GaAs oxide film was grown using a technique esentially similar to that in Example 1. However, in this example, the electrons were emitted from a tungsten filament, as shown in FIG. 1. The pressure in the production region was $10^{-4}$ torr while an oxygen pressure of $2 \times 10^{-3}$ torr was maintained in the interaction region. A magnetic field of approximately 200 gauss was used to confine the electrons and direct them toward the substrate.

EXAMPLE 3

Layers were grown on InP, GaP and GaAlAs using the apparatus of example 1.

EXAMPLE 4

Figure 6:
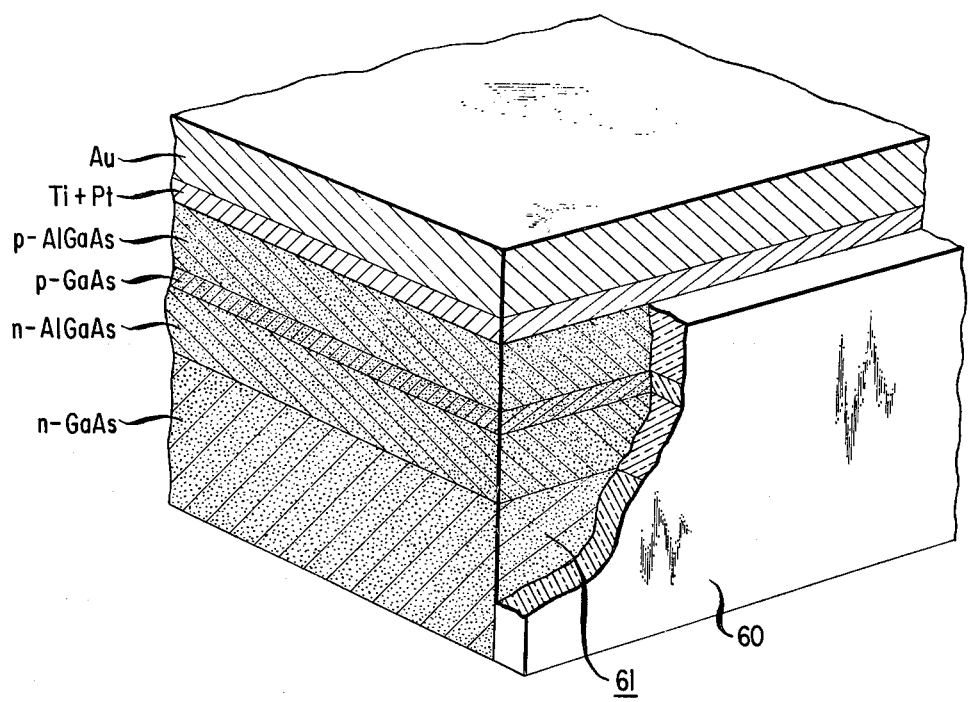
FIG. 6 represents an oxide layer grown on a heterostructure semiconductor surface.

An oxide layer was grown on the heterostructure semiconductor surface shown in FIG. 6 using the apparatus of Example 1. In this example, the surface presented to the flux of electrons consists of regions of various semiconductor compositions 61 as shown in FIG. 6. The particular structure shown in this figure operates as a solid-state laser. The composition of the oxide layer 60, at any particular point is dependent on the substrate composition at that point. Appropriate oxides, each depending on the underlying substrate, are grown simultaneously on the surface and act as passivating regions. These oxide layers protect the underlying substrate from ambient contaminants, while transmitting the light produced within the laser.

What is claimed is:

1. A method of growing a native semiconductor oxide layer comprising:
   A. placing a semiconductor substrate in an oxygen environment comprising oxygen at a pressure of less than $9 \times 10^{-3}$ torr;
   B. directing a beam comprising essentially electrons of density between $10^8$ electrons/cc and $10^{12}$ electrons/cc toward the substrate; and
   C. biasing the substrate between 0.2 and 500 volts positive with respect to the source of electrons,
   whereby a native semiconductor oxide layer is grown.

2. The method of claim 1 wherein the electron source is a filament.

3. The method of claim 1 wherein the electrons are generated in a plasma.

4. The method of claim 1 wherein the electrons are further directed toward the substrate by means of a magnetic field greater than 50 gauss.

5. The method of claim 1 wherein the bias voltage is between 50 volts and 90 volts.

6. The method of claim 1 wherein the semiconductor is a compound semiconductor.

7. The method of claim 6 wherein the semiconductor is selected from the group consisting of GaAs, GaP, InP and GaAlAs.

8. The method of claim 1 wherein the semiconductor substrate presented to the electrons is a heterostructure semiconductor surface.

9. The method of claim 1 wherein the surface of the semiconductor is oriented approximately perpendicular with respect to the electron beam.

10. The method of claim 1 wherein a portion of the semiconductor surface is shielded from the electron beam while a selected portion of the semiconductor surface is exposed to the electron beam.

11. The method of claim 10 wherein a portion of the semiconductor surface is shielded from the electron beam using a shadow mask.

12. The method of claim 11 wherein the semiconductor body is so oriented relative to the electron beam that a portion of the semiconductor body shadow masks part of the semiconductor surface from the electron beam.

* * * * *